United States Patent [19]

Kato

[11] Patent Number: 4,683,449

[45] Date of Patent: Jul. 28, 1987

[54] NOISE REDUCTION COMPRESSION SYSTEM CONTROLLED BY COMPRESSED OUTPUT COMPONENTS WHICH ARE IN-BAND

[75] Inventor: Shigeru Kato, Saitama, Japan

[73] Assignee: Pioneer Electronic Corporation, Tokyo, Japan

[21] Appl. No.: 729,781

[22] Filed: May 2, 1985

[30] Foreign Application Priority Data

May 2, 1984 [JP] Japan .................................. 59-89091
May 2, 1984 [JP] Japan .................................. 59-89092

[51] Int. Cl.⁴ .......................... H04B 1/64; H03G 7/00
[52] U.S. Cl. ..................................... 333/14; 381/106; 330/85; 330/279; 330/144
[58] Field of Search .................. 333/14; 381/106, 104; 435/72; 370/109, 85; 330/279, 149, 144, 126, 136; 375/30

[56] References Cited

U.S. PATENT DOCUMENTS

| | | | |
|---|---|---|---|
| 3,112,462 | 11/1963 | De Jager et al. | 333/14 |
| 4,101,849 | 7/1978 | Blackner et al. | 333/14 |
| 4,169,219 | 9/1979 | Beard | 333/14 X |
| 4,249,042 | 2/1981 | Orban | 381/106 |
| 4,281,295 | 7/1981 | Nishimura et al. | 330/126 X |
| 4,363,006 | 12/1982 | Ishigaki et al. | 381/106 X |
| 4,493,091 | 1/1985 | Gundry | 333/14 |
| 4,507,791 | 3/1985 | Gundry | 333/14 X |
| 4,539,526 | 9/1985 | Davis | 330/126 X |

FOREIGN PATENT DOCUMENTS 2485836 12/1981 France .................................. 333/14

Primary Examiner—Eugene R. LaRoche
Assistant Examiner—Benny T. Lee
Attorney, Agent, or Firm—Sughrue, Mion, Zinn, Macpeak & Seas

[57] ABSTRACT

A noise reduction system which is unaffected by bandwidth limitations of the transmission system with which the noise reduction system is employed. The noise reduction system is of a type including a compressor, the transmission system, which receives a compressed signal from the compressor, and an expander for expanding a signal outputted by the transmission system. In accordance with the invention, a low-pass filter having a pass band corresponding to the transmission band of the transmission system is provided in the stage prior to the compressor. In another embodiment, a low-pass filter is provided in a stage prior to a level detector within the compressor.

2 Claims, 22 Drawing Figures

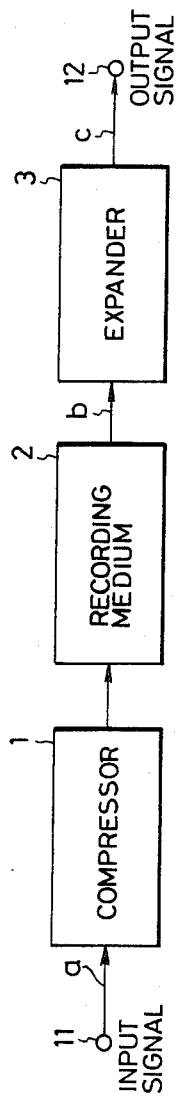
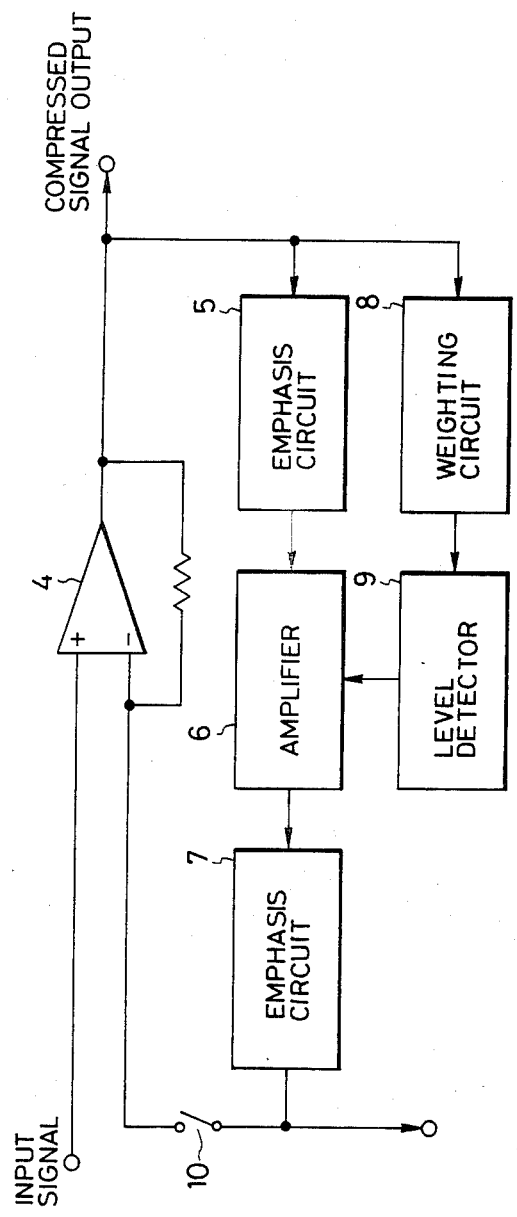

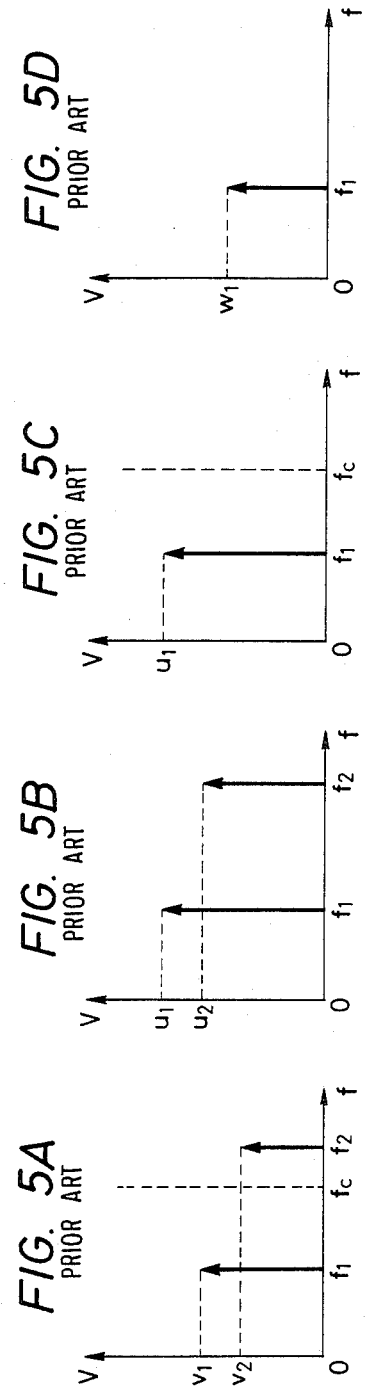
FIG. 5A PRIOR ART
FIG. 5B PRIOR ART
FIG. 5C PRIOR ART
FIG. 5D PRIOR ART
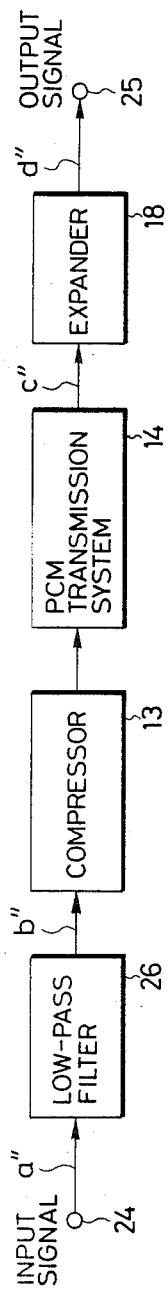
FIG. 6

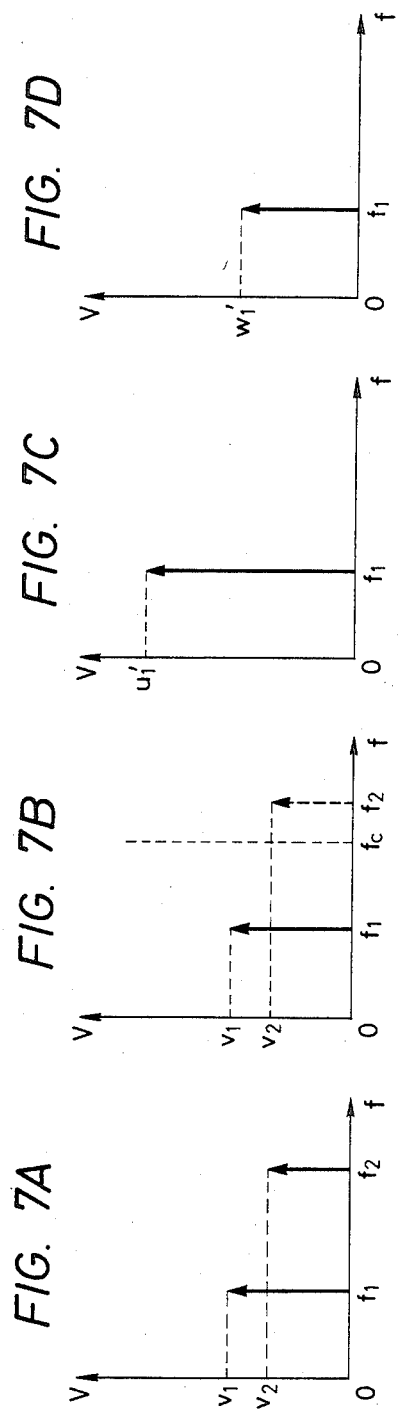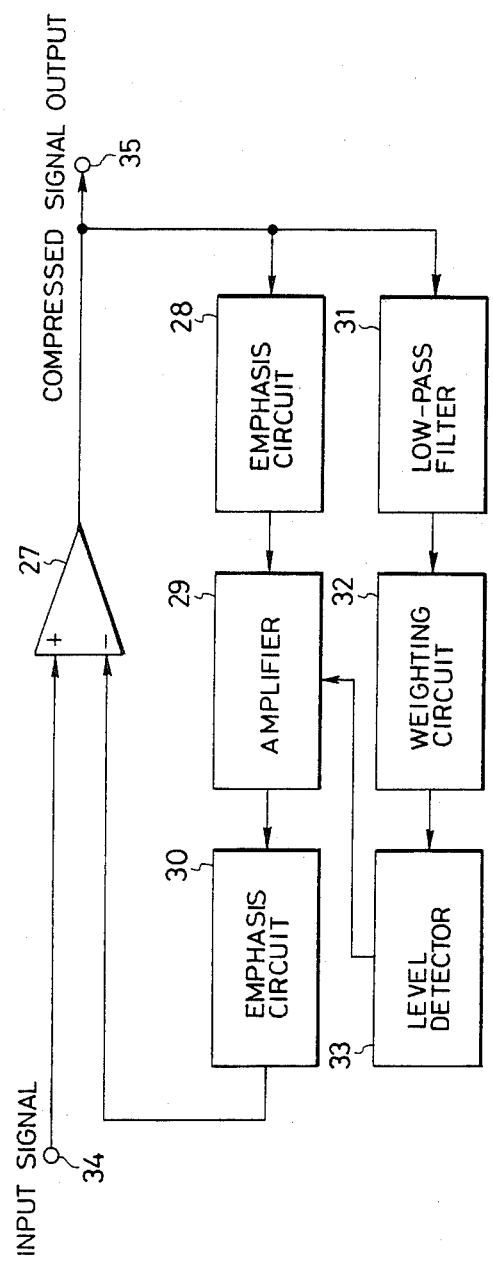

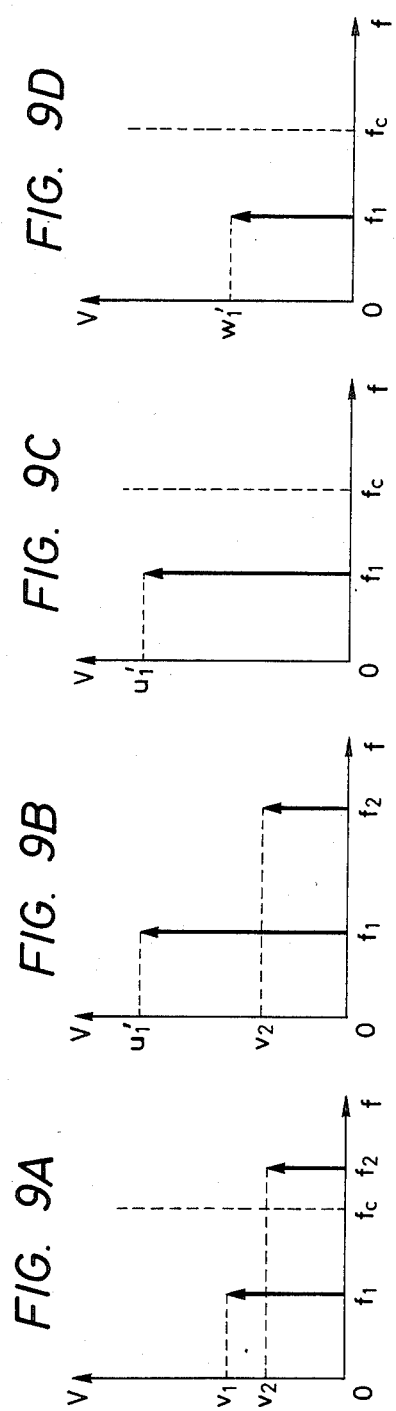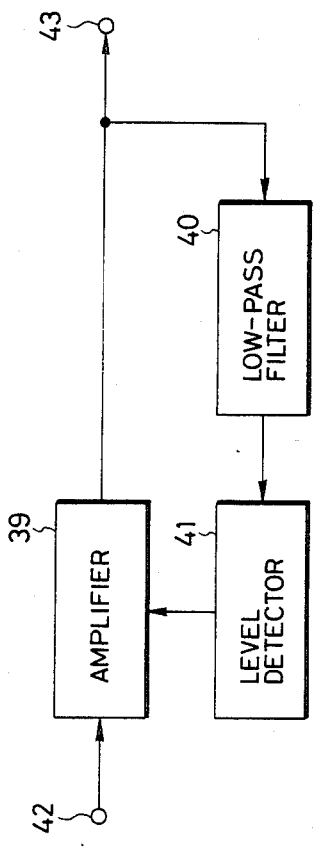

NOISE REDUCTION COMPRESSION SYSTEM CONTROLLED BY COMPRESSED OUTPUT COMPONENTS WHICH ARE IN-BAND

BACKGROUND OF THE INVENTION

The present invention relates to an NR (Noise Reduction) system or circuit for use in audio equipment.

NR circuits are widely used for improving the S/N (Signal/Noise) ratio of an audio system such as a compact cassette deck. Recently, NR circuits have been applied to PCM (Pulse Code Modulation) systems employing a relatively small number of bits per sample, for instance, as commonly used in 8 mm video systems, where an excellent S/N ratio is not otherwise obtainable.

The NR circuit is not affected by bandwidth restrictions in the case of usage in an AM or FM system. Also, in a compact cassette deck, there is generally a sufficient bandwidth (0 to 20 KHz) available such that no adverse effects are produced.

Referring to FIG. 1, a prior art noise reduction system of a compact cassette deck is shown. For recording an input signal on a recording medium, low-level signals are emphasized by a compressor (encoder) 1 prior to recording. For playback, the signal reproduced from the recording medium is expanded by an expander (decoder) 3 to reduce the gain in those portions emphasized by the compressor 1 during recording.

Referring to FIG. 2, the NR circuit used in the compressor 1 and the expander 3 is shown. In this drawing, reference numeral 4 denotes a differential amplifier; 5, an emphasis circuit; 6, an amplifier having a controllable gain; 7, an emphasis circuit; 8, a weighting circuit; 9, a level detector; and 10, a compression/expansion switch. The switch 10 is set to the compression mode in the ON state and to the expansion mode in the OFF state. In the noise reduction system thus constructed, the level of the signal component of a given frequency applied to an input signal terminal 11 in FIG. 1 can be made to have the same level upon being outputted to an output signal terminal 12 because the bandwidth of the signal is not restricted by the transmission system, in this case, the recording medium 2.

This effect is illustrated in FIGS. 3A to 3C. FIGS. 3A to 3C show the voltage level of the signal component of the frequency $f_1$ at respective points a, b, and c in FIG. 1. The signal component with a voltage level v as shown in FIG. 3A is increased to a voltage level u by the compressor by applying a certain gain before the signal is recorded on the recording medium 2. For playback, the reproduced signal, which has not been bandwidth limited by the recording medium 2, is applied to the expander 3. In the expander 3, the voltage level is reduced to a level w before being applied to the output signal terminal 12.

In the NR circuit shown in FIG. 2, the input to a level detector 9 during recording is the same as the input to the level detector 9 during reproduction if no bandwidth limiting occurs in the transmission system. Therefore the gain of the gain-controllable amplifier 6 is the same in both cases, as a result the input signal level v is the same as the output signal level w.

A PCM transmission system has a bandwidth of half the sampling frequency. For example, an 8 mm video system has an audio pass band below 15.734 KHz. Referring to FIG. 4A, a noise reduction system for use in a PCM transmission system is shown. In FIG. 4A, reference numeral 13 denotes a compressor and 14 denotes a PCM transmission system composed of a low-pass filter 15, a transmission converting system 16, and a low-pass filter 17. Reference numeral 18 denotes an expander. Referring to FIG. 4B, the construction of the transmission converting system 16 is shown. In this drawing, reference numeral 19 notes an A/D converter; 20, a digital recording system; 21, a magnetic recording and reproducing system; 22, a digital reproducing system; and 23, a D/A converter.

In the case of the PCM system 14 thus constructed, as shown in FIG. 4A, because the system has an upper limit of its audio pass band of $f_c$, if the signal inputted from the input signal terminal 24 includes frequency components higher than the frequency $f_c$, the signal levels of frequency components lower than $f_c$ are reduced below their original level when outputted to the output signal terminal 25. This action is shown in FIGS. 5A to 5D. FIGS. 5A to 5D show the voltage level of signal components of frequencies $f_1$ and $f_2$ at respective points a', b', c', and d' in FIG. 4A. Hereinafter, it is assumed that the frequency $f_c$ of the pass band of the PCM transmission system 14 and that the frequency $f_2$ is higher than the frequency $f_c$.

As shown in FIG. 5A, the signal components of the frequency $f_1$ with the voltage level $v_1$ and the signal component with frequency $f_2$ with the voltage level $v_2$ are increased to voltage levels $u_1$ and $u_2$, respectively, as shown in FIG. 5B, by the compressor 13 before being applied to the PCM transmission system 14. Since the PCM transmission system 14 has a pass band lower than the upper limit frequency $f_c$, only the signal component of the frequency $f_1$ is passed, as shown in FIG. 5C; the signal component of the frequency $f_2$ is blocked.

Therefore, in the case where the NR circuit as shown in FIG. 2 is used in the compressor 13 and the expander 18 in FIG. 4A, the input to the level detector 9 during recording time is different from the input to the level detector 9 during reproduction. Thus, the gain of the amplifier 6 is also changed. Accordingly, the expander 18 reduces the voltage level of the component of the frequency $f_1$ to the level $w_1$ by the use of a gain larger than that applied by the compressor 13. Therefore, the value of $v_1$ is $v_1 > w_1$, which results in a disadvantage that the output level of the signal component of the frequency $f_1$ is reduced in comparison with the input due to bandwidth restriction in the transmission system.

SUMMARY OF THE INVENTION

Accordingly, an object of the present invention is to provide a noise reduction system capable of maintaining an output signal level equal to an input signal level even if the audio device in which the noise reduction system is employed includes a PCM transmission system with a restricted bandwidth.

In accordance with the above and other objects, the invention provides a noise reduction system including a low-pass filter having a pass band corresponding to the transmission band of the transmission system. With this arrangement, the input to the level detector during recording is made equal to the input to the level detector during reproduction.

According to another aspect of the noise reduction system of the invention, there is provided a low-pass filter having a pass band corresponding to the transmission band of the transmission system in which the input signal level to the level detector of the NR circuit during recording is that same as that for reproduction.

BRIEF DESCRIPTION OF THE DRAWINGS

FIG. 1 shows a noise reduction system employing a transmission system with no bandwidth limitations;

FIG. 2 shown an NR circuit used for the noise reduction system of FIG. 1;

FIGS. 5A-5D show signal components at several points in the noise reduction system of FIG. 4;

FIG. 6 shows a preferred embodiment of a noise reduction system of the present invention;

FIGS. 7A-7D shows signal components at several points in the noise reduction system of FIG. 6;

FIG. 8 shows a compressor of a noise reduction circuit in accordance with another embodiment of the invention;

FIGS. 9A to 9D show signal components at several points in FIG. 8; and

FIG. 10 shows another embodiment of a compressor of a noise reduction circuit of the invention.

DESCRIPTION OF THE PREFERRED EMBODIMENTS

Figure 3A:
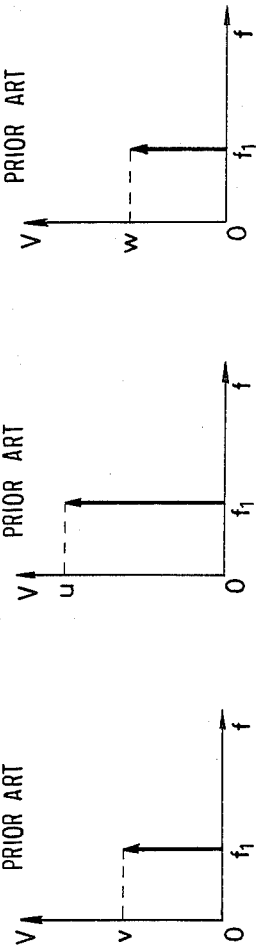
FIGS. 3A-3C show signal components at several points in the NR circuit of FIG. 2.
Figure 3B:
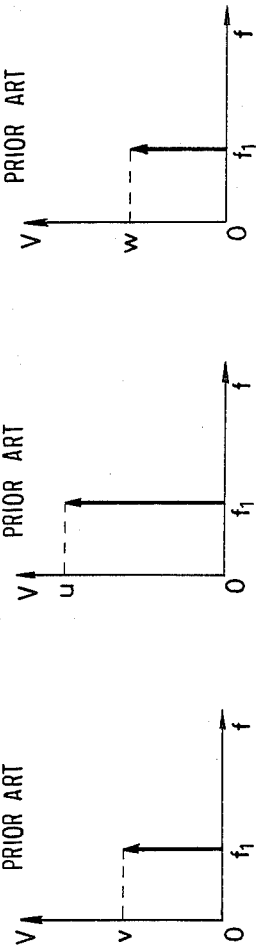
Figure 3C:
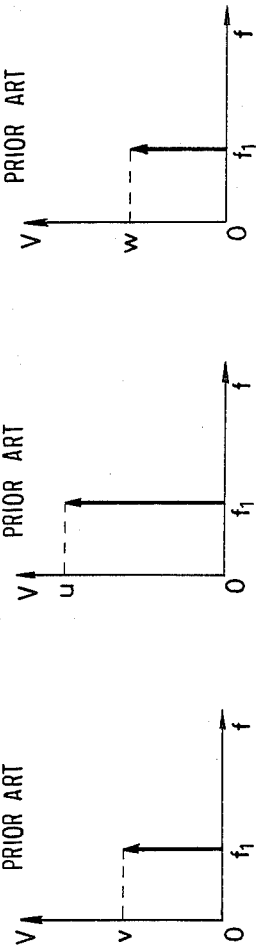
Figure 4A:
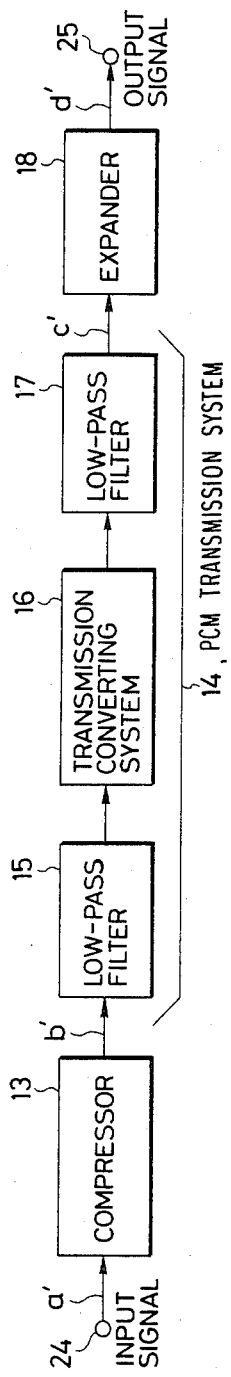
FIGS. 4A, 4B show a noise reduction system used with a PCM transmission system.
Figure 4B:
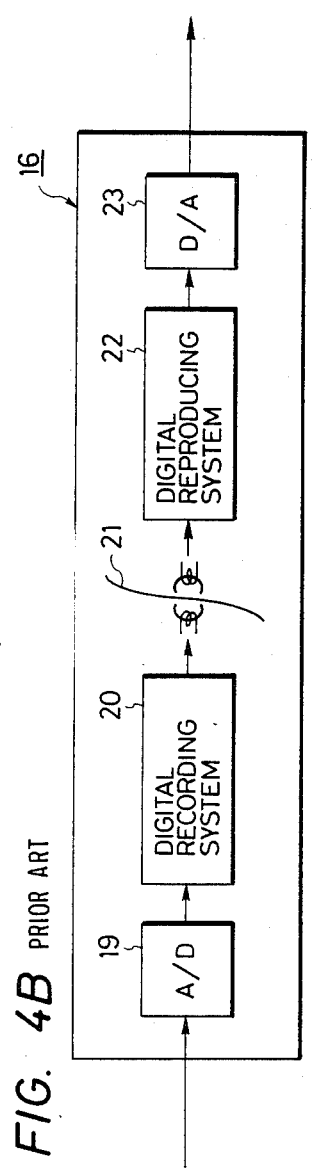

Referring to FIG. 6, a preferred embodiment of the present invention will be described. As shown in FIG. 6, a low-pass filter 26 is provided having a pass band corresponding to the transmission band of the PCM transmission system 14 in a stage prior to a compressor 13 of the noise reduction system as shown in FIG. 4A. By the provision of the low-pass filter 26, the input signal level at an input signal terminal 24 is made equal to the output signal level at an output signal terminal 25.

This action is shown in FIGS. 7A to 7D. FIGS. 7A to 7D show the voltage level of the signal components of frequencies $f_1$ and $f_2$ at points a", b", c", and d", respectively, in FIG. 6. Similar to the case illustrated in FIGS. 5A to 5D, it is assumed that the frequency $f_1$ is lower than the upper limit frequency $f_c$ of the bandpass of the PCM transmission system and that the frequency $f_2$ is higher than the frequency $f_c$. The signal component of the frequency $f_1$ with the voltage level $v_1$ and the signal component of the frequency $f_2$ with the voltage level $v_2$, as shown in FIG. 7A, are applied to the low-pass filter 26. The low-pass filter 26 blocks the signal component of the frequency $f_2$ as shown in FIG. 7B, and only the signal component of the frequency $f_1$ reaches the compressor 13. In the compressor 13, the voltage level is increased from the level $v_1$ to the level $u_1'$, before the signal is applied to the PCM transmission system 14. Since the signal component of the frequency $f_2$ is already blocked by the low-pass filter 26, the signal component of the frequency $f_1$, having the increased level $u_1'$ as shown in FIG. 7C, is outputted from the PCM transmission system 14 and applied to the expander 18. The frequency $f_1$ of the signal component applied to the compressor 13 is equal to the frequency $f_1$ of the signal component applied to the expander 18. Thus, if the NR circuit as shown in FIG. 2 is used in the compressor 13 and the expander 18, the input to the level detector 9 during recording is equal to the input to the level detector 9 during reproduction, and therefore the gain of the amplifier 6 is also equal in the two cases. Therefore, the expander 18 reduces the voltage level to the level $w_1'$, as determined by the gain of the compressor 13. Hence, by the provision of the low-pass filter 26, the voltage level $v_1$ of the input signal is made equal to the voltage level $w_1'$ of the output signal.

In the above-described embodiment, a PCM transmission system is employed. However the present invention is not limited to a PCM transmission system, and it is believed apparent that the present invention is applicable to any transmission system having a limited bandwidth.

According to the present invention, a low-pass filter is provided in the stage prior to the compressor, and the pass band of the filter corresponds to the transmission band of the band-limited transmission system. As a result, the gain of the amplifier of the NR circuit during recording is made equal to that during reproduction, and therefore it is possible to maintain the output signal level of the noise reduction system equal to the input signal level.

Referring to FIG. 8, another embodiment of the present invention is shown. This embodiment relates to an NR circuit provided in the compressor of the recording system. In FIG. 8, reference numeral 27 denotes a differential amplifier; 28, an emphasis circuit; 29, a gain-controllable amplifier; 30, an emphasis circuit; 31, a low-pass filter; 32, a weighting circuit; and 33, a level detector. An input signal is applied to an input terminal 34, and a compressed signal is outputted from an output terminal 35. The pass band of the low-pass filter 31 is made to correspond to the transmission band of the PCM transmission system. This compressor may be used in the noise reduction system of FIG. 1 as the compressor 1.

Referring to FIGS. 9A to 9D, the voltage levels are shown of the signal components of the frequencies $f_1$ and $f_2$ at the points a, b, c, and d in the system of FIG. 1 when the compressor 1 is implemented with the circuit of FIG. 8. It is assumed that the frequency $f_1$ is lower than the upper limit frequency $f_c$ of the PCM transmission system (represented by the recording medium), and that the frequency $f_2$ is higher than the frequency $f_c$. The signal component of the frequency $f_1$ with the voltage level $v_1$ and signal component of the frequency $f_2$ with the voltage level $v_2$ as shown in FIG. 9A are shown. The low-pass filter 31 of the NR circuit in FIG. 6 used in the compressor 1 cuts off signal components of frequencies above $f_c$ while components of frequencies below $f_c$ are applied to the level detector 33. Therefore, since the amplifier 29 amplifies only signal components of frequencies below $f_c$, the output of the compressor 1 is increased to a value $u_1'$ with respect to the signal component of the frequency $f_1$, as shown in FIG. 9B. In the PCM transmission system, only the signal component of the frequency $f_2$ is blocked and only the signal component of the frequency $f_1$ is supplied to the expander 3, as shown in FIG. 9C. In the case where the NR circuit as shown in FIG. 2 is used for the expander 38, the level of the signal component of the frequency $f_1$ inputted to the level detector 29 is the same as that of the input signal component of the frequency $f_1$ applied to the level detector 33 in FIG. 8, and therefore the gain of the amplifier 29 of FIG. 8 during recording is the same as the gain of the amplifier 6 in FIG. 2 during reproduction, and the voltage level is reduced to the voltage level $w_1'$, which is the same as the input signal level $v_1$.

Referring to FIG. 10, another embodiment of the present invention is shown. This NR circuit, which is used for the compressor, is composed of a gain-controllable amplifier 39, a low-pass filter 40, and a level detector 41. The input signal is supplied to an input terminal 42, and the compressed signal is outputted upon an output terminal 43. The pass band of the low-pass filter 40 is selected in correspondence to the transmission band of the PCM transmission system.

According to this embodiment, similar to the embodiment of FIG. 8, the amplifier 39 receives signal components of frequencies below the upper limit frequency $f_c$ of the PCM transmission system, and thus it is possible to hold the level of the output signal from the noise reduction system to the level of the input signal.

According to these embodiments of the present invention, a low-pass filter is provided in the stage prior to the level detector in the NR circuit used for the compressor, and the pass band of the low-pass filter is set to correspond to the transmission band of the transmission system. Accordingly, the gain of the amplifier during recording is the same as that during reproduction, and hence the level of the output signal from the noise reduction system is made equal to the level of the input signal. That is, the limited bandwidth of the transmission system does not adversely affect the performance of the noise reduction system.

I claim:

1. A compression circuit for a noise reduction system coupled to a bandwidth-limited transmission system having a transmission band defined by bandwidth limitations, said circuit receiving and compressing an input signal to provide a compressed output signal to said transmission system, said circuit comprising subtraction means for subtracting a feedback signal from said input signal to obtain said compressed output signal, a controllable gain amplifier for processing said compressed output signal in accordance with a control signal to obtain said feedback signal, a low-pass filter having a pass band substantially the same as said transmission band of said transmission system, said filter receiving said compressed output signal and providing a filter output; and level detector means responsive to said filter output for providing said control signal to said controllable gain amplifier, whereby the gain of said amplifier is controlled in accordance only with components of said compressed output signal within the bandwidth of said transmission system.

2. A compression circuit for a noise reduction system coupled to a bandwidth-limited transmission system having a transmission band defined by bandwidth limitations, said circuit receiving and compressing an input signal to provide a compressed output signal to said transmission system, said circuit comprising subtraction means for subtracting a feedback signal from said input signal to obtain said compressed output signal, a controllable gain amplifier for processing said compressed output signal in accordance with a control signal to obtain said feedback signal, a filter having a pass band no greater than said transmission band of said transmission system, said filter receiving said compressed output signal and providing a filter output; and level detector means responsive to said filter output for providing said control signal to said controllable gain amplifier, whereby the gain of said amplifier is controlled in accordance only with components of said compressed output signal within the bandwidth of said transmission system.

* * * * *